United States Patent
Ji et al.

(10) Patent No.: US 10,747,660 B2
(45) Date of Patent: Aug. 18, 2020

(54) METHOD AND SYSTEM FOR FORMING AND USING MEMORY SUPERBLOCKS BASED ON PERFORMANCE GRADES

(71) Applicant: SK hynix Inc., Gyeonggi-do (KR)

(72) Inventors: Seung Gu Ji, Seoul (KR); Chung Un Na, Gyeonggi-do (KR); Byeong Gyu Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/055,680

(22) Filed: Aug. 6, 2018

(65) Prior Publication Data

US 2019/0196959 A1  Jun. 27, 2019

(30) Foreign Application Priority Data

Dec. 22, 2017  (KR) .................. 10-2017-0177986

(51) Int. Cl.
*G06F 3/06* (2006.01)
*G06F 12/02* (2006.01)
*G06F 12/0802* (2016.01)
*G11C 29/44* (2006.01)
*G11C 8/12* (2006.01)
*G11C 29/04* (2006.01)

(52) U.S. Cl.
CPC .......... *G06F 12/0246* (2013.01); *G06F 3/064* (2013.01); *G06F 3/0656* (2013.01); *G06F 3/0688* (2013.01); *G06F 12/0802* (2013.01); *G11C 29/44* (2013.01); *G06F 3/061* (2013.01); *G06F 3/0608* (2013.01); *G06F 3/0611* (2013.01); *G06F 2003/0691* (2013.01); *G06F 2212/1016* (2013.01); *G06F 2212/2022* (2013.01); *G11C 8/12* (2013.01); *G11C 2029/0411* (2013.01); *G11C 2029/4402* (2013.01)

(58) Field of Classification Search
CPC .... G06F 12/0246; G06F 3/064; G06F 3/0688; G06F 3/061; G06F 3/0611; G06F 3/0613
USPC ........................................................ 711/118
See application file for complete search history.

(56) References Cited

U.S. PATENT DOCUMENTS

| | | | |
|---|---|---|---|
| 2015/0043277 A1* | 2/2015 | Fitzpatrick ............ | G11C 16/10 365/185.11 |
| 2016/0064155 A1* | 3/2016 | Jiang ..................... | H01G 11/82 361/502 |
| 2016/0147444 A1* | 5/2016 | Neerman ............... | G06F 3/0644 711/103 |
| 2016/0364155 A1* | 12/2016 | Fitzpatrick .......... | G11C 11/5635 |
| 2018/0366210 A1* | 12/2018 | Park ...................... | G11C 29/82 |
| 2019/0121727 A1* | 4/2019 | Kim ..................... | G06F 12/0253 |

FOREIGN PATENT DOCUMENTS

KR     101573089     11/2015

* cited by examiner

*Primary Examiner* — Than Nguyen
(74) *Attorney, Agent, or Firm* — IP & T Group LLP

(57) ABSTRACT

A memory system includes a plurality of memory devices, each including a plurality of memory blocks; and a controller configured to evaluate performance grades of the plurality of memory blocks, form super blocks spanning the plurality of memory devices by selecting memory blocks, among the plurality of memory blocks, to be included in each of the super blocks based on the performance grades, and write-access an opened super block, among the super blocks.

16 Claims, 10 Drawing Sheets

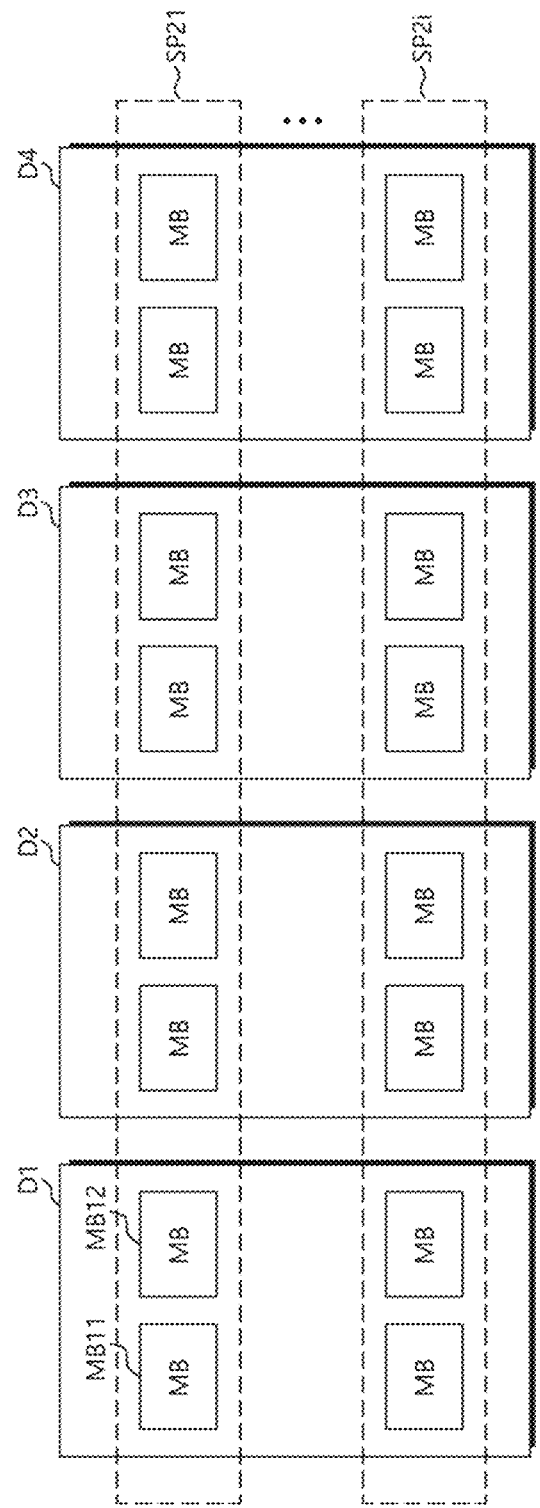

| Memory block | Memory unit | Performance value | Performance grade |
|---|---|---|---|
| MB11 | MU11 | UPV1 | High performance/ Middle performance/ Low performance |
| | MU12 | UPV2 | |
| | ⋮ | ⋮ | |
| | MU1k | UPVk | |

Ⓗ : High performance
Ⓜ : Middle performance
Ⓛ : Low performance

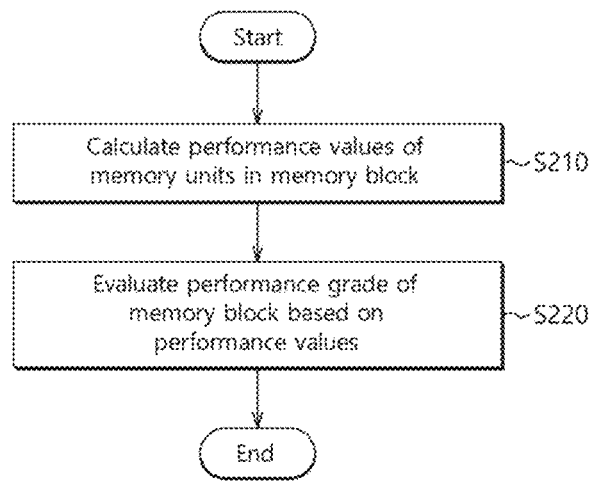
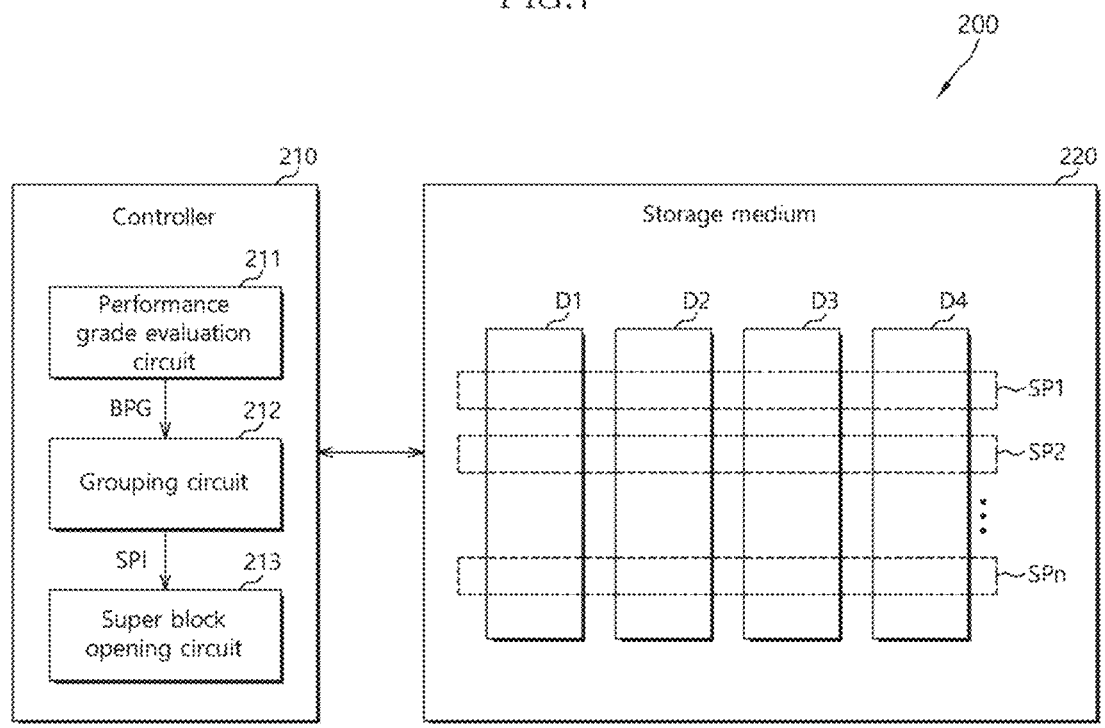

METHOD AND SYSTEM FOR FORMING AND USING MEMORY SUPERBLOCKS BASED ON PERFORMANCE GRADES

CROSS-REFERENCE TO RELATED APPLICATION

The present application claims priority under 35 U.S.C. § 119(a) to Korean application number 10-2017-0177986, filed on Dec. 22, 2017, in the Korean Intellectual Property Office, which is incorporated herein by reference in its entirety.

BACKGROUND

1. Technical Field

Various embodiments of the present invention generally relate to a memory system. Particularly, the embodiments relate to a memory system including a memory device.

2. Related Art

Memory systems store data provided by an external device in response to a write request. Memory systems may also provide stored data to an external device in response to a read request. Examples of external devices that use memory systems include computers, digital cameras, cellular phones, and the like. A memory system may be embedded in an external device during manufacturing of the external device or may be fabricated separately and then connected afterwards to an external device.

SUMMARY

Various embodiments are directed to a memory system which provides maximum operational performance when accessing a plurality of memory devices in parallel, and an operating method thereof.

In an embodiment, a memory system may include: a plurality of memory devices, each including a plurality of memory blocks; and a controller configured to evaluate performance grades of the plurality of memory blocks, form super blocks spanning the plurality of memory devices by selecting memory blocks, among the plurality of memory blocks, to be included in each of the super blocks based on the performance grades, and write-access an opened super block, among the super blocks.

In an embodiment, a method for operating a memory system including a plurality of memory devices, each of which includes a plurality of memory blocks, may include: evaluating performance grades of the plurality of memory blocks; forming super blocks spanning the plurality of memory devices by selecting memory blocks, among the plurality of memory blocks, to be included in each of the super blocks based on the performance grades; and write-accessing an opened super block among the super blocks.

In an embodiment, a memory system may include: a plurality of memory blocks, each including a plurality of memory units; and a controller configured to: evaluate operation conditions of the respective memory blocks based on operation conditions of the respective memory units; group two or more memory blocks, among the plurality of memory blocks, having similar operation conditions into super blocks to form at least a high performance super block having memory blocks of high operation conditions and a low performance super block having memory blocks of low operation conditions; and assign the high performance super block for an externally requested operation and the low performance super block for an internally requested operation.

In the memory system and the operating method thereof according to embodiments, maximum operational performance may be achieved when accessing a plurality of memory devices in parallel.

BRIEF DESCRIPTION OF THE DRAWINGS

FIGS. 2A and 2B are diagrams describing a method for the controller of FIG. 1 to form a super block in accordance with an embodiment.

FIG. 6 is a flow chart describing a method for operating the performance grade evaluation circuit of FIG. 1 in accordance with an embodiment.

FIG. 7 is a block diagram illustrating a memory system in accordance with an embodiment.

DETAILED DESCRIPTION

Figure 1:
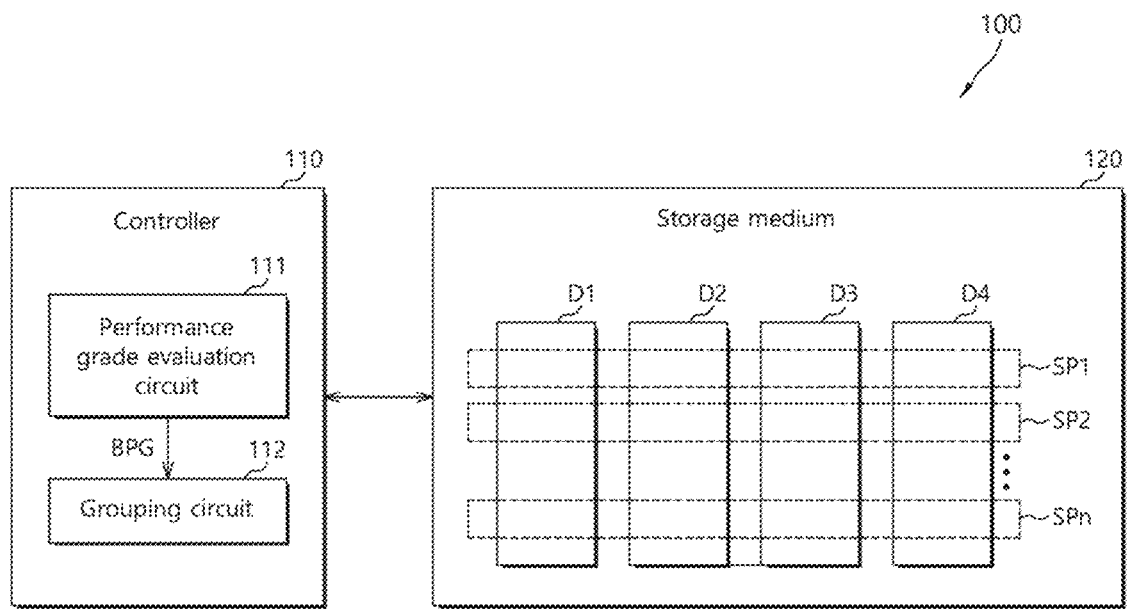
FIG. 1 is a block diagram illustrating a memory system in accordance with an embodiment.

In the present invention, advantages, features and methods for achieving them will become more apparent in light of the following embodiments described in conjunction with the drawings. The present invention may, however, be embodied in different forms and thus is not limited to the embodiments set forth herein. Rather, these embodiments are provided to describe the present invention in detail to the extent that a person skilled in the art to which the invention pertains can practice the present invention.

It is to be understood herein that embodiments of the present invention are not limited to the particulars shown in the drawings, and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments and is not intended to limit the scope of the present invention. Moreover, throughout the specification, reference to "an embodiment" or the like is not necessarily to only one embodiment, and different references to "an embodiment" or the like are not necessarily to the same embodiment(s).

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include its plural form and vice versa, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements.

A memory system and an operating method thereof will be described below with reference to the accompanying drawings through various embodiments.

FIG. 1 is a block diagram illustrating a memory system 100 in accordance with an embodiment.

The memory system 100 may be configured to store data provided from an external host device in response to a write request of the host device. Also, the memory system 100 may be configured to provide stored data to the host device in response to a read request of the host device.

The memory system 100 may be configured as a Personal Computer Memory Card International Association (PCMCIA) card, a compact flash (CF) card, a smart media card, a memory stick, a multimedia card in the form of an MMC, an eMMC, an RS-MMC and an MMC-micro, a secure digital card in the form of an SD, a mini-SD and a micro-SD, a universal flash storage (UFS), or a solid state drive (SSD).

The memory system 100 may include a controller 110 and a storage medium 120.

The controller 110 may control general operations of the memory system 100. The controller 110 may access the storage medium 120 to process a request of the host device. Also, the controller 110 may access the storage medium 120 to perform an internal management operation or a background operation of the memory system 100 even in the absence of a request of the host device. An access to the storage medium 120 may include a write access or a read access. The controller 110 may access the storage medium 120 by controlling a write operation or a read operation of the storage medium 120.

The controller 110 may form a plurality of super blocks SP1 to SPn spanning memory devices D1 to D4 in the storage medium 120, and open and write-access a super block selected among the super blocks SP1 to SPn. To "open" a super block may mean to specify or designate a super block to store data. The controller 110 may write-access only super block(s) opened at a time of the write-access, among the super blocks SP1 to SPn. When an opened super block no longer has any empty region, the corresponding super block may be "closed." When a currently opened super block has no empty region, the controller 110 may select and open a new super block. The number of super blocks opened at a specified point of time may be one or more. The controller 110 may open one or more super blocks for each of various uses.

Figure 2A:
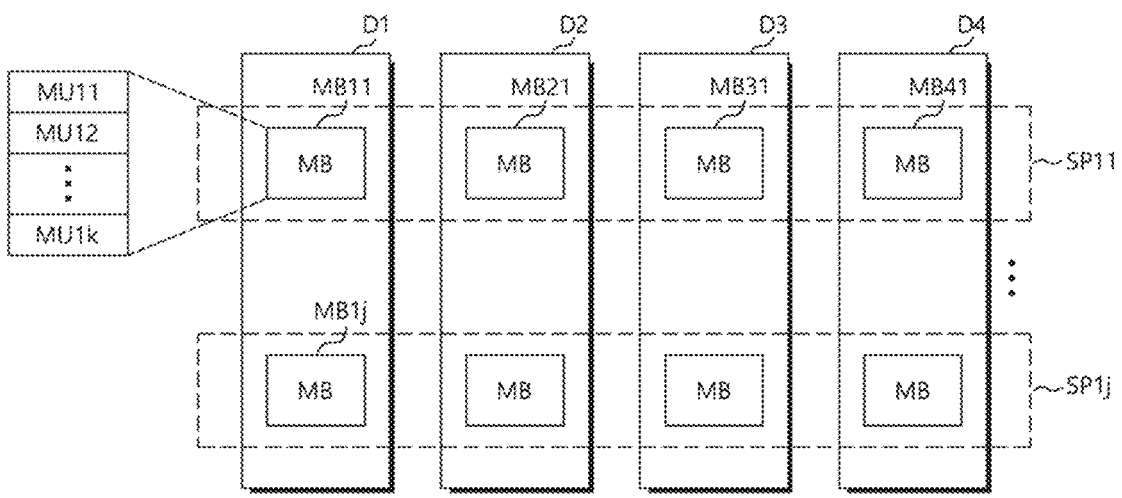

FIGS. 2A and 2B are describing a method for the controller 110 of FIG. 1 to form a super block in accordance with an embodiment.

Referring to FIG. 2A, first, each of the memory devices D1 to D4 may include a plurality of memory blocks MB. For example, the memory device D1 may include a plurality of memory blocks MB11 to MB1$j$. A memory block may be a unit by which a memory device performs an erase operation. In other words, a memory device may erase in a single operation the data stored in a memory block. A memory device may perform an erase operation simultaneously for one or more memory blocks.

Each of the memory blocks MB may include memory units. For example, the memory block MB11 may include memory components or elements, referred to as memory units MU11 to MU1$k$. A memory unit may be a unit by which a memory device performs a write operation or a read operation. In other words, a memory device may write data in a single operation in a memory unit or may read data in a single operation from a memory unit. A memory device may perform a write operation or a read operation simultaneously for one or more memory units.

The controller 110 may form super blocks SP11 to SP1$j$ spanning the memory devices D1 to D4. The controller 110 may select one memory block in each of the memory devices D1 to D4, and may group selected memory blocks as a single super block. For example, the controller 110 may select memory blocks MB11, MB21, MB31 and MB41 in the memory devices D1 to D4 respectively, and may group them to form a super block SP11. Each of the super blocks SP11 to SP1$j$ may include one memory block of each memory device.

Memory blocks in a single super block, for example, the memory blocks MB11, MB21, MB31 and MB41 in the super block SP11, may be write-accessed in parallel. Namely, in order to store data in the storage medium 120, the controller 110 may open a super block, and may write-access in parallel the memory blocks in the opened super block.

In the present embodiment, the locations of memory blocks to be grouped as a single super block are not limited to any particular locations within their respective memory devices. For example, the controller 110 may group memory blocks which have the same block offset value in their respective memory devices D1 to D4, as a single super block. The block offset value of a memory block may be a number or an address assigned to the corresponding memory block in a memory device. For example, each of the memory blocks MB11, MB21, MB31 and MB41 grouped as the super block SP11 may have the block offset value of "1" in its corresponding memory device D1 to D4.

For another example, the controller 110 may group memory blocks which have different block offset values in their respective memory devices D1 to D4, as a single super block.

Referring to FIG. 2B, the controller 110 may form super blocks SP21 to SP2$i$ spanning the memory devices D1 to D4. Unlike in FIG. 2A, the controller 110 may select two memory blocks in each of the memory devices D1 to D4, and may group selected memory blocks as a single super block.

Each of the memory devices D1 to D4 may simultaneously access the memory blocks in the same super block. For example, the memory device D1 may simultaneously access memory blocks MB11 and MB12 in the super block SP21.

According to an embodiment, the controller 110 may select more than two memory blocks in each of the memory devices D1 to D4, and may group selected memory blocks as a single super block.

The performance of a super block which is formed as described above may be determined by the performances of the respective memory blocks included therein. Because the memory blocks in a super block are accessed in parallel, the operational performance of the super block is influenced by a memory block which operates with a low performance. That is to say, a high performance memory block may be diluted by a low performance memory block in the same super block, and this may cause performance degradation in the entire storage medium 120.

Referring again to FIG. 1, the super blocks SP1 to SPn may be formed in consideration of the performances of respective memory blocks in accordance with an embodiment. According to a method to be described later, each of the super blocks SP1 to SPn may be configured by memory blocks which have similar performances. Therefore, memory blocks which operate with a high performance may be grouped together in one or more super blocks to provide maximum performance, and memory blocks which operate with a low performance may be excluded from such super blocks to prevent the low performance memory blocks from exerting influence on the memory blocks which operate with a high performance.

The controller 110 may include a performance grade evaluation circuit 111 and a grouping circuit 112.

The performance grade evaluation circuit 111 may evaluate the performance grades of the respective memory blocks in the memory devices D1 to D4, for example, the respective memory blocks MB of FIG. 2A.

First, the performance grade evaluation circuit 111 may calculate the performance values of the memory units in each of the memory blocks MB. The performance grade evaluation circuit 111 may calculate the performance value of a memory unit based on a time required to access the memory unit by a memory device, that is, an access operation time.

The performance grade evaluation circuit 111 may evaluate the performance grade of each memory block MB based on the performance values of memory units. The performance grade evaluation circuit 111 may evaluate the performance grade of a memory block based on the performance values of the memory units in the corresponding memory block. For example, the performance grade evaluation circuit 111 may calculate a representative performance value from, or based on, the performance values of the memory units in a memory block, and may evaluate or determine a grade corresponding to the representative performance value as the performance grade of the corresponding memory block. A method of operating the performance grade evaluation circuit 111 is described in detail below with reference to FIG. 3.

The grouping circuit 112 may form the super blocks SP1 to SPn by selecting memory blocks to be included in each of the super blocks SP1 to SPn, based on performance grades BPG of the memory blocks MBs evaluated by the performance grade evaluation circuit 111. The grouping circuit 112 may form the super blocks SP1 to SPn in such a manner that each of the super blocks SP1 to SPn includes memory blocks which have the same performance grade. Each of the super blocks SP1 to SPn may be configured by memory blocks which have the same performance grade. A method of operating the grouping circuit 112 is described in detail below with reference to FIG. 4.

The performance grade evaluation circuit 111 and the grouping circuit 112 may perform the above-described operations in an initial operation of or during the use of the memory system 100.

The storage medium 120 may store data transmitted from the controller 110 and may read stored data and transmit read data to the controller 110, according to control of the controller 110. The storage medium 120 may include the memory devices D1 to D4.

Each of the memory devices D1 to D4 may be a non-volatile memory device such as a flash memory device (e.g., NAND flash or a NOR flash), an FeRAM (ferroelectric random access memory), a PCRAM (phase change random access memory), an MRAM (magnetic random access memory), or an ReRAM (resistive random access memory).

Alternatively, each of the memory devices D1 to D4 may be a volatile memory device such as a DRAM (dynamic random access memory), an SDRAM (synchronous dynamic random access memory), or an SRAM (static random access memory).

While it is illustrated in FIG. 1 that the storage medium 120 includes four memory devices D1 to D4, the number of memory devices is not limited to four. Any suitable number of memory devices may be accommodated.

Figures 3A, 3B:
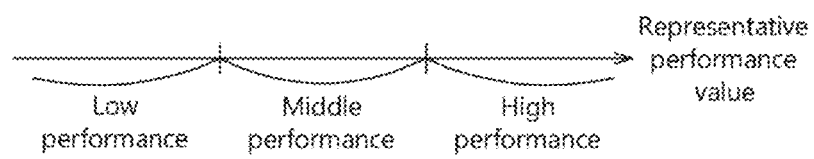
FIGS. 3A and 3B are diagrams describing a method for the performance grade evaluation circuit of FIG. 1 to evaluate the performance grade of a memory block in accordance with an embodiment.

FIGS. 3A and 3B are diagrams describing a method for the performance grade evaluation circuit 111 of FIG. 1 to evaluate the performance grade of the memory block MB11 of FIG. 2A in accordance with an embodiment. The controller 110 may evaluate the performance grade of each of the memory blocks MB of FIG. 2 according to a method described below.

Referring to FIG. 3A, the performance grade evaluation circuit 111 of FIG. 1 may calculate performance values UPV1 to UPVk of the respective memory units MU11 to MU1$k$ in the memory block MB11. The performance grade evaluation circuit 111 may calculate the performance value of a memory unit based on a time required to access the memory unit by the memory device D1, that is, an access operation time.

For example, the performance grade evaluation circuit 111 may calculate, by controlling the memory device D1 to perform a write operation for the memory unit MU11, the performing time of the write operation, and may calculate the performance value UPV1 of the corresponding memory unit MU11 based on the performing time of the write operation. The performing time of the write operation may be, for example, an elapsed time from when the performance grade evaluation circuit 111 commands the memory device D1 to perform the write operation to when the completion of performing the write operation is reported from the memory device D1.

Similar to the write operation, the performance grade evaluation circuit 111 may calculate, by controlling the memory device D1 to perform a read operation for the memory unit MU11, the performing time of the read operation, and may calculate the performance value UPV1 of the corresponding memory unit MU11 based on the performing time of the read operation. The performing time of the read operation may be, for example, an elapsed time from when the performance grade evaluation circuit 111 commands the memory device D1 to perform the read operation to when the completion of performing the read operation is reported from the memory device D1.

According to an embodiment, the performance grade evaluation circuit 111 may calculate the performance value UPV1 of the memory unit MU11 by considering all, or some combination, of the performing times of a write operation, a read operation and an erase operation for the corresponding memory unit MU11.

The performance grade evaluation circuit 111 may evaluate the performance grade of the memory block MB11 based on the performance values UPV1 to UPVk of the memory units MU11 to MU1k. A performance grade may be, for example, any of three levels, that is, a high performance, a middle performance and a low performance. According to an embodiment, one or more of these three levels may be more finely divided to provide more performance levels.

In detail, the performance grade evaluation circuit 111 may calculate the representative performance value from, or based on, the performance values UPV1 to UPVk, and may evaluate or determine the performance grade of the memory block MB11 based on the calculated representative performance value. For example, as shown in FIG. 3B, there may be a continuum of representative performance values divided into non-overlapping ranges respectively designating low performance, middle performance and high performance. Using such a construct, the performance grade evaluation circuit 111 may determine the performance grade corresponding to the representative performance value by identifying in which range on the continuum the present calculated representative performance value falls.

Referring again to FIG. 3A, the representative performance value of the performance values UPV1 to UPVk may be a minimum value, a maximum value or an average value of the performance values UPV1 to UPVk or any other value determined according to a suitable rule.

As another example, the representative performance value of the performance values UPV1 to UPVk may be, for example, any one of such performance values. Also, the performance grade evaluation circuit 111 may calculate performance values for only some of the memory units MU11 to MU1k, to calculate a representative performance value.

According to an embodiment, the performance grade evaluation circuit 111 may calculate, by controlling the memory device D1 to perform an erase operation for the memory block MB11, the performing time of the erase operation, and may calculate the performance value of the memory block MB11 based on the performing time of the erase operation. The performing time of the erase operation may be, for example, an elapsed time from when the performance grade evaluation circuit 111 commands a memory device D1 to perform the erase operation to when the completion of performing the erase operation is reported from the memory device D1.

In a manner similar to the above method of evaluating the performance grade of the memory block MB11 based on the representative performance value of the performance values UPV1 to UPVk, the performance grade evaluation circuit 111 may evaluate the performance grade of the memory block MB11 based on the erase operation for the memory block MB11, as a representative performance value.

Figure 4:
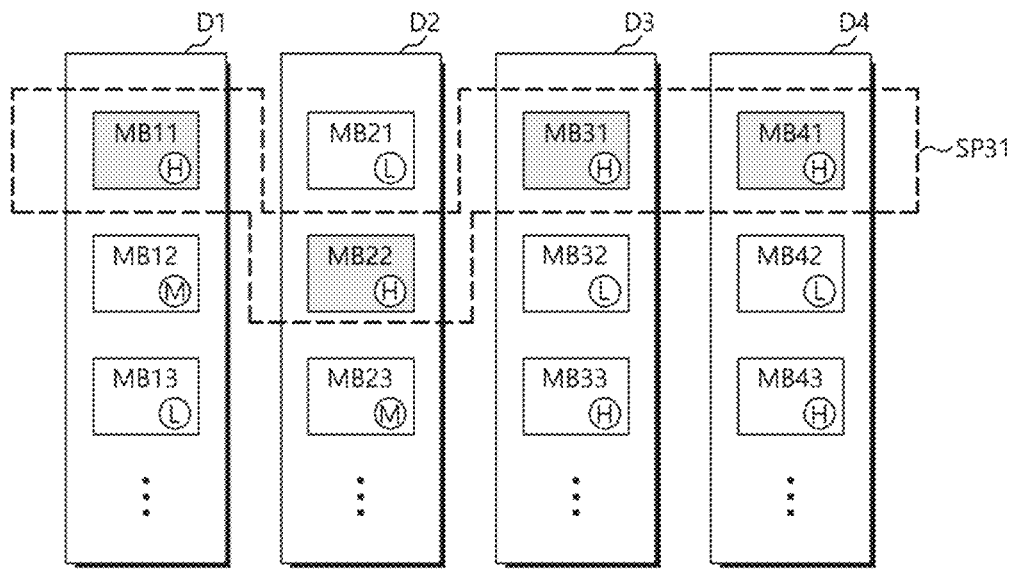
FIG. 4 is a diagram describing a method for the grouping circuit of FIG. 1 to form a super block by grouping memory blocks in accordance with an embodiment.

FIG. 4 is a diagram describing a method for the grouping circuit 112 of FIG. 1 to form a super block SP31 by grouping memory blocks MB11 to MB43 in accordance with an embodiment. FIG. 4 illustrates some memory blocks MB11 to MB43 in the memory devices D1 to D4. FIG. 4 shows the performance grades of the memory blocks MB11 to MB43 evaluated by the performance grade evaluation circuit 111, that is, grades of a high performance, a middle performance and a low performance.

Referring to FIG. 4, the grouping circuit 112 may group memory blocks which have the same performance grade. For example, the memory blocks MB11, MB22, MB31 and MB41, each of which is evaluated as a high performance block, may be grouped to form a super block SP31.

As another example, the grouping circuit 112 may group the memory blocks MB13, MB21, MB32 and MB42, each of which is evaluated as a low performance block, as a single super block.

That is to say, the grouping circuit 112 may select memory blocks which have the same performance grade, in the respective memory devices D1 to D4, and may group such selected memory blocks as a super block.

Therefore, according to an embodiment, the memory blocks MB11, MB22, MB31 and MB41, which operate with high performance, may be grouped as the super block SP31 and be accessed in parallel, thereby providing maximum performance.

Figure 5:
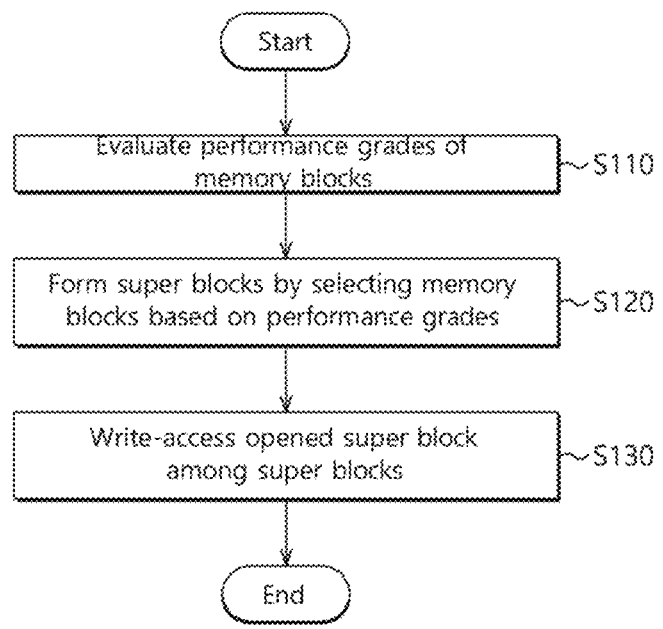
FIG. 5 is a flow chart describing a method for operating the memory system of FIG. 1 in accordance with an embodiment.

FIG. 5 is a flow chart describing a method for operating the memory system 100 of FIG. 1 in accordance with an embodiment.

Referring to FIG. 5, at step S110, the performance grade evaluation circuit 111 may evaluate the performance grades BPG of the memory blocks in the memory devices D1 to D4.

At step S120, the grouping circuit 112 may form the super blocks SP1 to SPn by selecting memory blocks to be included in each of the super blocks SP1 to SPn based on the performance grades BPG. The grouping circuit 112 may form the super blocks SP1 to SPn in such a manner that each of the super blocks SP1 to SPn includes memory blocks which have the same performance grade.

At step S130, the controller 110 may write-access a super block which is opened, among the super blocks SP1 to SPn. The controller 110 may write-access in parallel the memory blocks in the opened super block.

FIG. 6 is a flow chart describing a method for operating the performance grade evaluation circuit 111 of FIG. 1 in accordance with an embodiment. The process shown in FIG. 6 may be an example of the step S110 of FIG. 5. FIG. 6 shows a method for the performance grade evaluation circuit 111 of FIG. 1 to evaluate the performance grade of a memory block.

Referring to FIG. 6, at step S210, the performance grade evaluation circuit 111 may calculate the performance values of the one or more memory units in a memory block. The performance grade evaluation circuit 111 may calculate the performance value of a memory unit based on the time required to access the corresponding memory unit by a memory device, that is, an access operation time.

At step S220, the performance grade evaluation circuit 111 may evaluate the performance grade of the memory block based on the performance values of the memory units in that memory block. The performance grade evaluation circuit 111 may calculate the representative performance value from, or based on, the performance values, and may evaluate a grade corresponding to the representative performance value as the performance grade of the corresponding memory block.

FIG. 7 is a block diagram illustrating a memory system 200 in accordance with an embodiment.

Referring to FIG. 7, the memory system 200 may include a controller 210 and a storage medium 220. The storage medium 220 may be configured and operate in substantially the same way as the storage medium 120 of FIG. 1.

The controller 210 may include a performance grade evaluation circuit 211, a grouping circuit 212 and a super block opening circuit 213. The performance grade evaluation circuit 211 and the grouping circuit 212 may be configured and operate in substantially the same way as the performance grade evaluation circuit 111 and the grouping circuit 112, respectively, of FIG. 1. Therefore, detailed description of these components is omitted here.

The super block opening circuit 213 may determine a super block to open, among super blocks SP1 to SPn. The super block opening circuit 213 may select an appropriate super block in conformity with a use, by evaluating the super block performance grades of the super blocks SP1 to SPn.

In detail, the super block opening circuit 213 may evaluate the super block performance grade of a super block based on the performance grades of the memory blocks in the corresponding super block. For example, when the grouping circuit 212 groups memory blocks having the same performance grade as a super block, the super block opening circuit 213 may evaluate the performance grade of the corresponding memory blocks as the super block performance grade of the corresponding super block.

For example, since the super block SP31 shown in FIG. 4 is configured by the memory blocks MB11, MB22, MB31 and MB41, each evaluated as a high performance block, the super block opening circuit 213 may evaluate the super block performance grade of the super block SP31 as high performance. The super block opening circuit 213 may receive a grouping result, that is, information about the memory blocks in each of the super blocks SP1 to SPn and the performance grades of the memory blocks, from the grouping circuit 212, and may refer to the grouping result in evaluating a super block performance grade.

The super block opening circuit 213 may determine a super block to open, depending on a purpose of use, based on the super block performance grades of the super blocks SP1 to SPn. In other words, the super block opening circuit 213 may allocate various uses to the super blocks SP1 to SPn based on the super block performance grades of the super blocks SP1 to SPn.

For example, the super block opening circuit 213 may determine a host write super block for a host write operation. The host write operation may include a write operation to be performed in response to a request of the host device. Thus, the host write super block may be used to store data according to the host write operation.

For another example, the super block opening circuit 213 may determine a background super block for a background operation. The background operation may include a write operation to be performed for a management operation of the memory system 200 in the absence of a request of the host device. Thus, the background super block may be used to store data according to the background operation.

The super block opening circuit 213 may determine a super block having a super block performance grade that is lower than a reference grade or is of low performance, as a background super block. Namely, because the background operation does not necessarily have to be performed quickly, a super block of low performance may be used in the background operation. The super block opening circuit 213 may determine a super block having a higher performance, for example, a middle performance or a high performance, as a host write super block. Therefore, the host write operation may be processed without delay.

For another example, the super block opening circuit 213 may determine a reserved super block among the super blocks SP1 to SPn. The super block opening circuit 213 may determine a super block having a super block performance grade that is lower than a reference or is of low performance, as a reserved super block. Therefore, by delaying the use of a super block of low performance, the memory system 200 may maintain a high performance.

Figure 8:
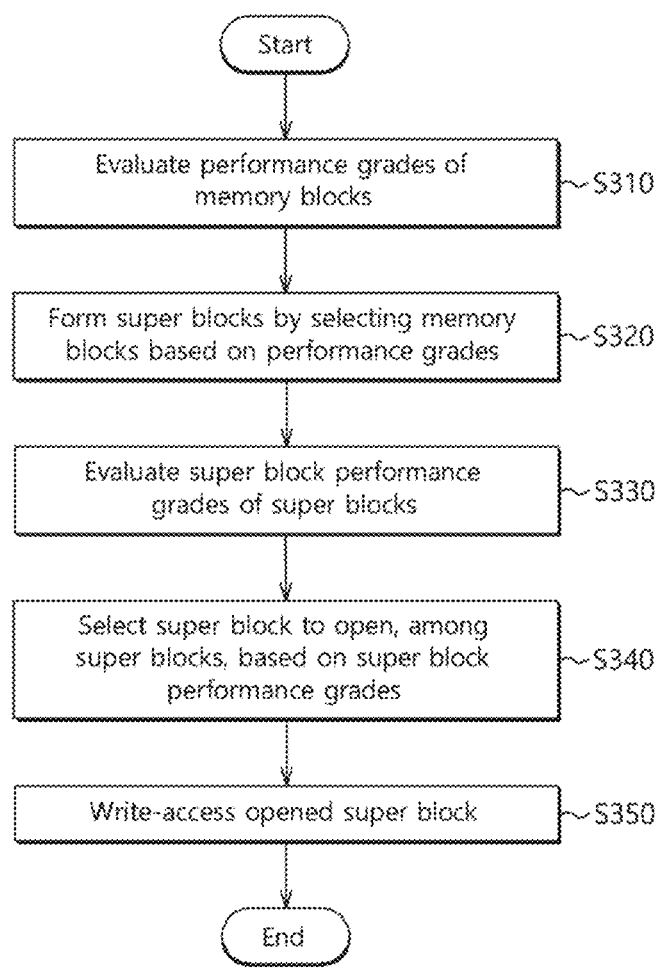
FIG. 8 is a flow chart describing a method for operating the memory system of FIG. 7 in accordance with an embodiment.

FIG. 8 is a flow chart describing a method for operating the memory system 200 of FIG. 7 in accordance with an embodiment.

Referring to FIG. 8, at step S310, the performance grade evaluation circuit 211 may evaluate the performance grades BPG of the memory blocks in the memory devices D1 to D4.

At step S320, the grouping circuit 212 may form the super blocks SP1 to SPn by selecting memory blocks to be included in each of the super blocks SP1 to SPn based on the performance grades BPG. The grouping circuit 212 may form the super blocks SP1 to SPn in such a manner that each of the super blocks SP1 to SPn includes memory blocks which have the same performance grade.

At step S330, the super block opening circuit 213 may evaluate the super block performance grades of the super blocks SP1 to SPn based on the performance grades of their memory blocks. That is, the super block performance grade of a given super block may be evaluated or determined based on the performance grades of the memory blocks in that super block.

At step S340, the super block opening circuit 213 may determine a super block to open, among the super blocks SP1 to SPn, based on the super block performance grades. The super block opening circuit 213 may select and open an appropriate super block in conformity with a purpose of use based on the performance grades of the super blocks.

At step S350, the controller 210 may write-access an opened super block, among the super blocks SP1 to SPn. The controller 210 may write-access in parallel the memory blocks in the opened super block.

Figure 9:
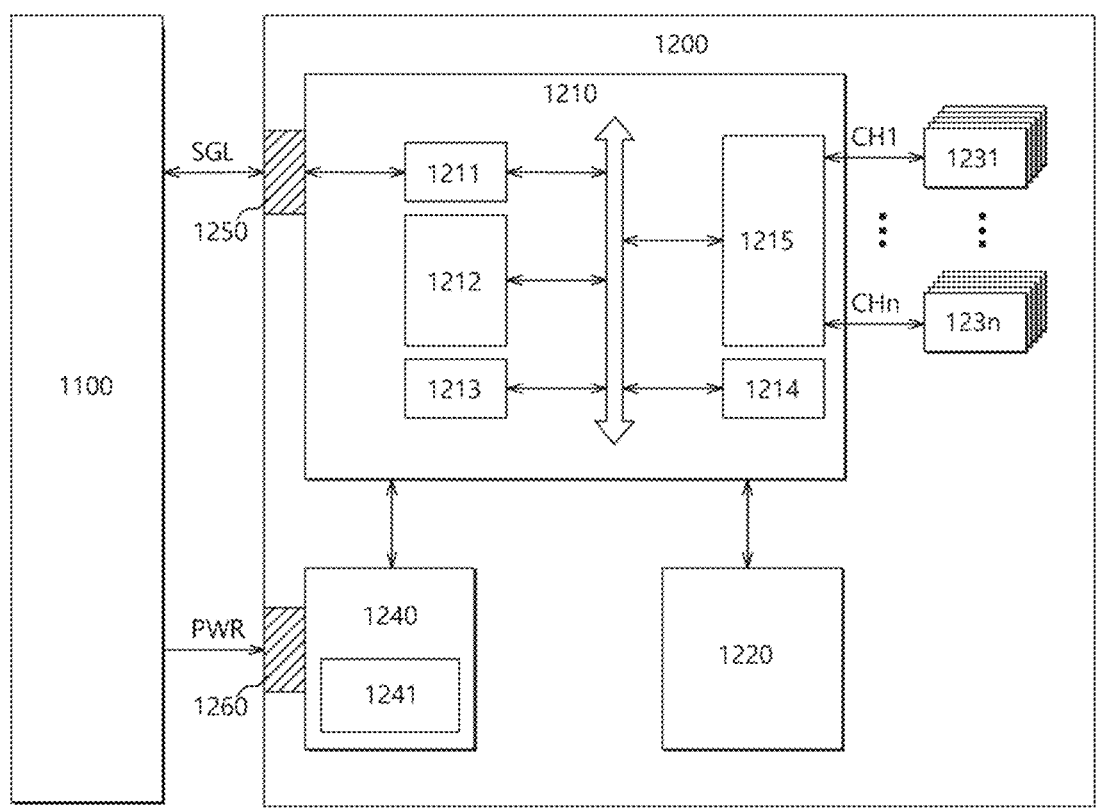
FIG. 9 is a diagram illustrating a data processing system including a solid state drive (SSD) in accordance with an embodiment.

FIG. 9 is a diagram illustrating a data processing system including a solid state drive (SSD) in accordance with an embodiment. Referring to FIG. 9, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface 1211, a control component 1212, a random access memory 1213, an error correction code (ECC) component 1214, and a memory interface 1215.

The host interface 1211 may exchange a signal SGL with the host device 1100 through the signal connector 1250. The signal SGL may include a command, an address, data, and so forth. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E), and universal flash storage (UFS).

The control component 1212 may analyze and process a signal SGL inputted from the host device 1100. The control component 1212 may control operations of background function blocks according to a firmware or a software for driving the SSD 1200. The random access memory 1213 may be used as a working memory for driving such a firmware or software.

The control component 1212 may be embodied as the controller 110 of FIG. 1 or the controller 210 of FIG. 7. The control component 1212 may form super blocks according to the above-described methods spanning nonvolatile memory devices which are coupled to common channels, among the nonvolatile memory devices 1231 to 123n.

The error correction code (KC) component 1214 may generate parity data of data to be transmitted to the nonvolatile memory devices 1231 to 123n. The generated parity data may be stored together with the data in the nonvolatile memory devices 1231 to 123n. The error correction code (ECC) component 1214 may detect an error of the data read out from the nonvolatile memory devices 1231 to 123n based on the parity data. If a detected error is within a correctable range, the error correction code (ECC) component 1214 may correct the detected error.

The memory interface 1215 may provide control signals such as commands and addresses to the nonvolatile memory devices 1231 to 123n according to the control of the control component 1212. Moreover, the memory interface 1215 may exchange data with the nonvolatile memory devices 1231 to 123n according to the control of the control component 1212. For example, the memory interface 1215 may provide the data stored in the buffer memory device 1220 to the nonvolatile memory devices 1231 to 123n, or provide the data read out from the nonvolatile memory devices 1231 to 123n to the buffer memory device 1220.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to the control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260 to the background of the SSD 1200. The power supply 1240 may include an auxiliary power supply 1241. The auxiliary power supply 1241 may supply power to allow the SSD 1200 to be properly terminated when a sudden power-off occurs. The auxiliary power supply 1241 may include large capacity capacitors.

The signal connector 1250 may be configured as any of various types of connectors depending on an interface protocol between the host device 1100 and the SSD 1200.

The power connector 1260 may be configured as any of various types of connectors depending on a power supply scheme of the host device 1100.

Figure 10:
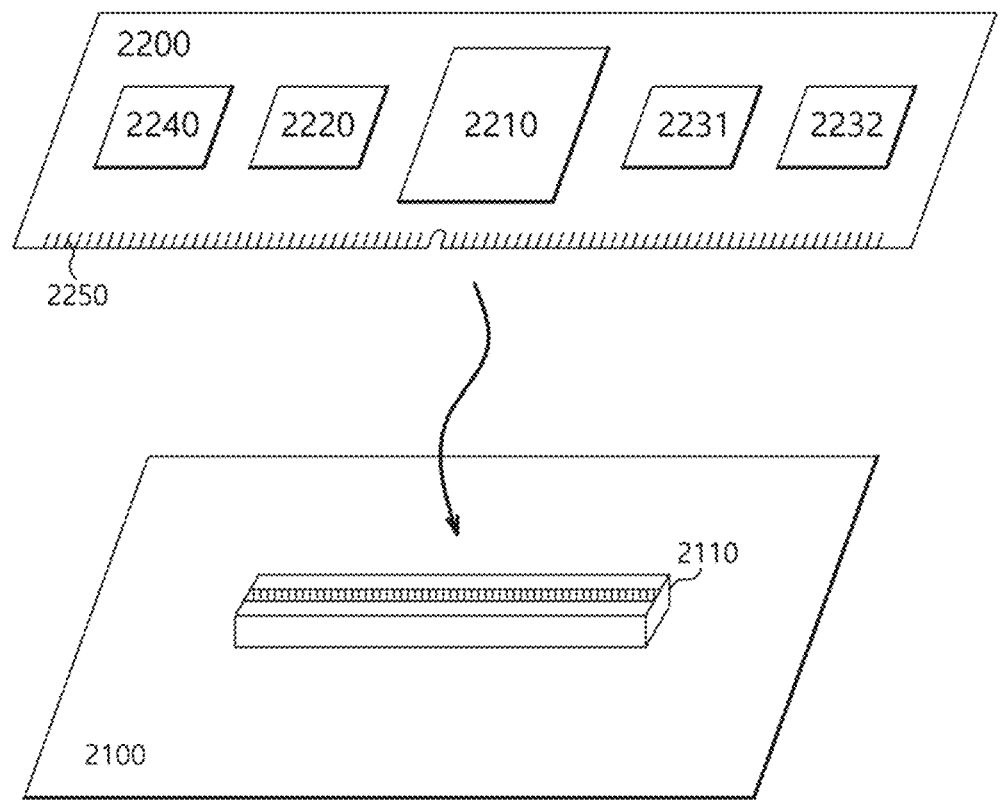
FIG. 10 is a diagram illustrating a data processing system including a memory system in accordance with an embodiment.

FIG. 10 is a diagram illustrating a data processing system including a memory system in accordance with an embodiment. Referring to FIG. 10, a data processing system 2000 may include a host device 2100 and a memory system 2200.

The host device 2100 may be configured in the form of a board such as a printed circuit board. Although not shown, the host device 2100 may include background function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control the general operations of the memory system 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as the storage media of the memory system 2200.

The PMIC 2240 may provide the power inputted through the connection terminal 2250 to the background of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data, and the like, and power may be transferred between the host device 2100 and the memory system 2200. The connection terminal 2250 may be constructed as any of various types depending on an interface protocol between the host device 2100 and the memory system 2200. The connection terminal 2250 may be disposed on any side of the memory system 2200.

Figure 11:
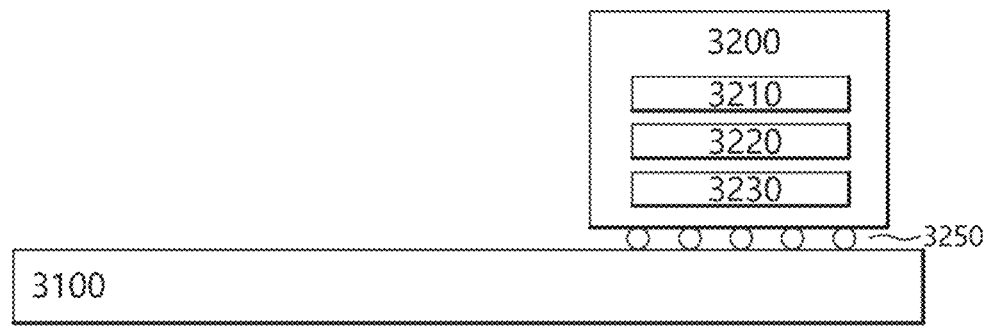
FIG. 11 is a diagram illustrating a data processing system including a memory system in accordance with an embodiment.

FIG. 11 is a diagram illustrating a data processing system including a memory system in accordance with an embodiment. Referring to FIG. 11, a data processing system 3000 may include a host device 3100 and a memory system 3200.

The host device 3100 may be configured in the form of a board such as a printed circuit board. Although not shown, the host device 3100 may include background function blocks for performing the function of a host device.

The memory system 3200 may be configured in the form of a surface-mount type package. The memory system 3200 may be mounted to the host device 3100 through solder balls 3250. The memory system 3200 may include a controller 3210, a buffer memory device 3220, and a nonvolatile memory device 3230.

The controller 3210 may control the general operations of the memory system 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
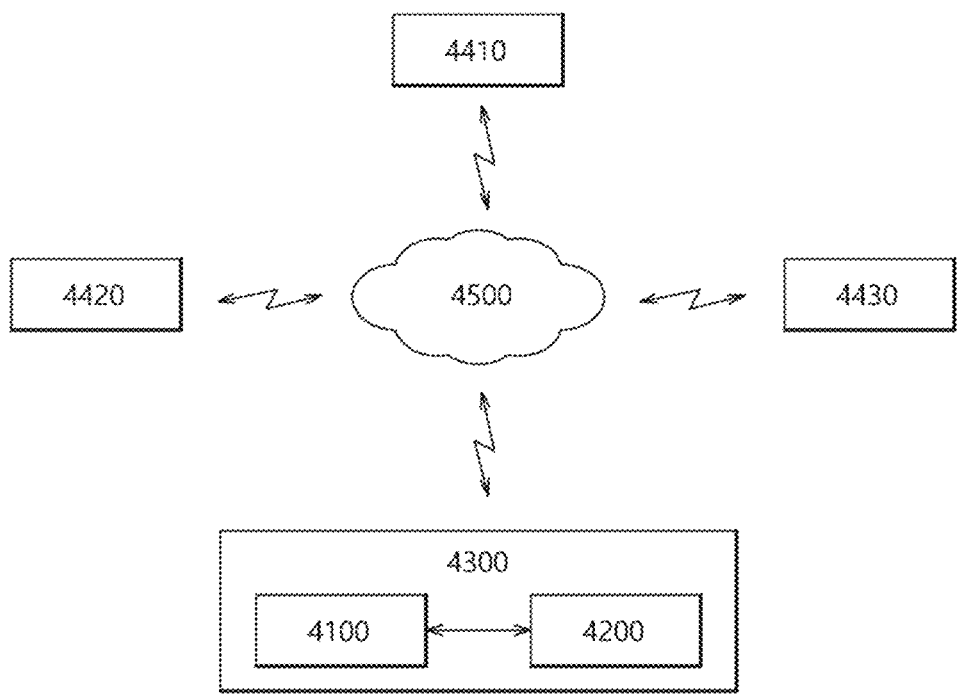
FIG. 12 is a diagram illustrating a network system including a memory system in accordance with an embodiment.

FIG. 12 is a diagram illustrating a network system including a memory system in accordance with an embodiment. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured as the memory system 100 of FIG. 1, the memory system 200 of FIG. 7, the SSD 1200 of FIG. 9, the memory system 2200 of FIG. 10 or the memory system 3200 of FIG. 11.

Figure 13:
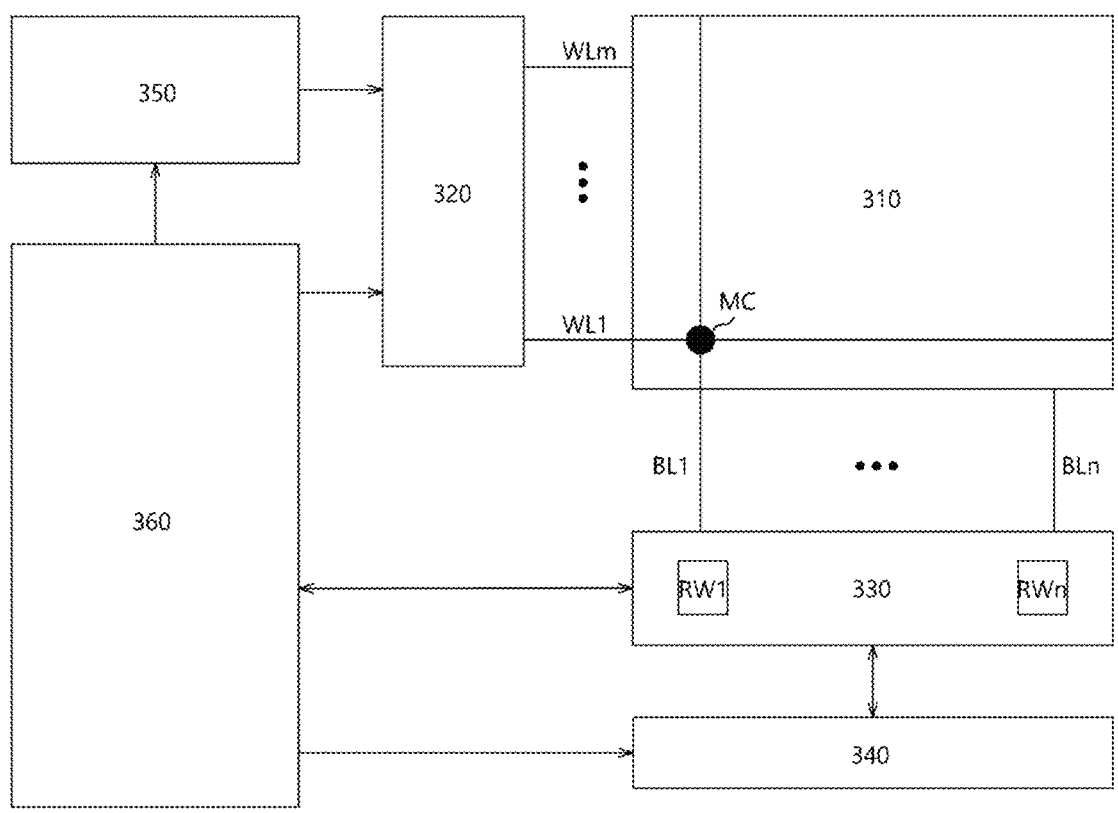
FIG. 13 is a block diagram illustrating a nonvolatile memory device included in a memory system in accordance with an embodiment.

FIG. 13 is a block diagram illustrating a nonvolatile memory device included in a memory system in accordance with an embodiment. Referring to FIG. 13, a nonvolatile memory device 300 may include a memory cell array 310, a row decoder 320, a data read/write block 330, a column decoder 340, a voltage generator 350, and control logic 360.

The memory cell array 310 may include memory cells MC which are arranged at areas where word lines WL1 to WLm and bit lines BL1 to BLn intersect.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/write block 330 may operate as a write driver or a sense amplifier depending on an operation mode. For example, the data read/write block 330 may operate as a write driver which stores data, provided from the external device, in the memory cell array 310 in a write operation. For another example, the data read/write block 330 may operate as a sense amplifier which reads out data from the memory cell array 310 in a read operation.

The column decoder 340 may operate according to the control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in background operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control the general operations of the nonvolatile memory device 300 based on control signals provided from the external device. For example, the control logic 360 may control the read, write and erase operations of the nonvolatile memory device 300.

While various embodiments have been described above, it will be understood by those skilled in the art in light of the present disclosure that the embodiments described may be modified or varied in numerous ways. Accordingly, the memory system and the operating method thereof described herein are not limited to the described embodiments. Rather, the present invention encompasses all embodiments and modifications and variations thereof that fall within the scope of the claims.

What is claimed is:

1. A memory system comprising:
a plurality of memory devices, each including a plurality of memory blocks, each of the plurality of memory blocks including one or more memory units; and
a controller configured to calculate performance values of the one or more memory units in each of the plurality of memory blocks, evaluate performance grade of each of the plurality of memory blocks based on the performance values of the one or more memory units in the corresponding memory block, form super blocks spanning the plurality of memory devices by selecting memory blocks, among the plurality of memory blocks, to be included in each of the super blocks based on the performance grades, and write-access an opened super block, among the super blocks,
wherein the controller calculates a performance value of each of the one or more memory units based on a time for a memory device to perform a read operation for a corresponding memory unit.

2. The memory system according to claim 1, wherein the controller forms each of the super blocks to include memory blocks which have the same performance grade.

3. The memory system according to claim 1, wherein the controller calculates a representative performance value of the performance values of the one or more memory units in the corresponding the memory block, and based on the representative performance value, evaluates a performance grade of the corresponding memory block.

4. The memory system according to claim 1, wherein the controller evaluates a super block performance grade of each of the super blocks based on performance grades of memory blocks in the corresponding super block, and determines a super block to open, among the super blocks, based on the super block performance grades.

5. The memory system according to claim 4, wherein the controller designates a super block, among the super blocks, having a super block performance grade lower than a reference grade, as a reserved super block, based on the super block performance grades.

6. The memory system according to claim 4, wherein the controller designates a super block, among the super blocks, having a super block performance grade lower than a reference grade, as a background super block, based on the super block performance grades.

7. The memory system according to claim 1, wherein the controller opens a new super block among the super blocks when the opened super block does not have an empty region.

8. The memory system according to claim 1, wherein the controller write-accesses in parallel memory blocks in the opened super block.

9. A method for operating a memory system including a plurality of memory devices, each of which includes a plurality of memory blocks, each of the plurality of memory blocks including one or more memory units, the method comprising:
    calculating performance values of the one or more memory units in each of the plurality of memory blocks;
    evaluating performance grade of each of the plurality of memory blocks based on the performance values of the one or more memory units in the corresponding memory block;
    forming super blocks spanning the plurality of memory devices by selecting memory blocks, among the plurality of memory blocks, to be included in each of the super blocks based on the performance grades;
    designating a super block with low performance among the super blocks, as a background super block; and
    write-accessing an opened super block among the super blocks,
    wherein the calculating of the performance values comprises calculating a performance value of each of the one or more memory units based on a time for a memory device to perform an access operation for a corresponding memory unit.

10. The method according to claim 9, wherein the forming of the super blocks comprises:
    forming each of the super blocks to include memory blocks which have the same performance grade.

11. The method according to claim 9, wherein the evaluating the performance grade of each of the plurality of memory blocks comprises:
    calculating a representative performance value of the performance values of the one or more memory units in the corresponding memory block; and
    evaluating a performance grade of the corresponding memory block based on the representative performance value.

12. The method according to claim 9, further comprising:
    evaluating a super block performance grade of each of the super blocks based on performance grades of memory blocks in the corresponding super block; and
    determining a super block to open, among the super blocks, based on the super block performance grades.

13. The method according to claim 12, further comprising:
    designating a reserved super block among the super blocks based on the super block performance grades.

14. The method according to claim 9, wherein the write-accessing of the opened super block comprises:
    write-accessing in parallel memory blocks in the opened super block.

15. The method according to claim 9, wherein the access operation is one of a write operation and a read operation.

16. A memory system comprising:
    a plurality of memory blocks, each including a plurality of memory units; and
    a controller configured to:
    evaluate operation conditions of the respective memory blocks based on operation conditions of the respective memory units;
    group two or more memory blocks, among the plurality of memory blocks, having similar operation conditions into super blocks to form at least a high performance super block having memory blocks of high operation conditions and a low performance super block having memory blocks of low operation conditions; and
    assign the high performance super block for an externally requested operation and the low performance super block for an internally requested operation,
    wherein the controller calculates an operation condition of each of the memory units based on a time for a memory device to perform a read operation for a corresponding memory unit.

* * * * *